US006927474B1

(12) United States Patent
O'Connell et al.

(10) Patent No.: US 6,927,474 B1
(45) Date of Patent: Aug. 9, 2005

(54) METHOD OF PROGRAMMING AN ANTIFUSE

(75) Inventors: Denis Finbarr O'Connell, Palo Alto, CA (US); Prasad Chaparala, Sunnyvale, CA (US)

(73) Assignee: National Semiconductor Corporation, Santa Clara, CA (US)

(*) Notice: Subject to any disclaimer, the term of this patent is extended or adjusted under 35 U.S.C. 154(b) by 13 days.

(21) Appl. No.: 10/428,992

(22) Filed: May 1, 2003

(51) Int. Cl.[7] .................................................. H01L 29/00

(52) U.S. Cl. ....................... 257/530; 257/532; 257/535; 257/536; 257/539; 438/131; 438/467; 438/60 D; 438/957

(58) Field of Search ................................ 257/530, 532, 257/535, 536, 539; 438/131, 467, 60 D, 957

(56) References Cited

U.S. PATENT DOCUMENTS

| | | | | | |
|---|---|---|---|---|---|
| 5,070,384 | A | * | 12/1991 | McCollum et al. | 257/530 |
| 5,196,724 | A | * | 3/1993 | Gordon et al. | 257/530 |
| 5,272,101 | A | * | 12/1993 | Forouhi et al. | 438/600 |
| 5,371,390 | A | * | 12/1994 | Mohsen | 257/209 |
| 5,384,481 | A | * | 1/1995 | Holzworth et al. | 257/530 |
| 5,404,029 | A | * | 4/1995 | Husher et al. | 257/50 |
| 5,412,244 | A | * | 5/1995 | Hamdy et al. | 257/530 |
| 5,527,745 | A | * | 6/1996 | Dixit et al. | 438/600 |
| 5,670,818 | A | * | 9/1997 | Forouhi et al. | 257/530 |
| 6,221,729 | B1 | * | 4/2001 | Dennison | 438/396 |
| 6,329,234 | B1 | | 12/2001 | Ma et al. | 438/210 |
| 6,413,815 | B1 | | 7/2002 | Lai et al. | 438/243 |
| 6,458,645 | B2 | | 10/2002 | DeBoer et al. | 438/240 |
| 6,479,854 | B1 | | 11/2002 | Thakur et al. | 257/306 |
| 6,506,981 | B1 | | 1/2003 | Liberkowski | 174/262 |

* cited by examiner

*Primary Examiner*—George Eckert
*Assistant Examiner*—Edgardo Ortiz
(74) *Attorney, Agent, or Firm*—Mark C. Pickering

(57) ABSTRACT

A metal-to-metal capacitor in a semiconductor integrated circuit is converted to a conductive structure by connecting the first metal plate of the capacitor to ground and the second metal plate of the capacitor to a programming voltage, thus causing the insulator material to breakdown and conduct current from the first plate to the second plate.

21 Claims, 13 Drawing Sheets

METHOD OF PROGRAMMING AN ANTIFUSE

DETAILED DESCRIPTION OF THE INVENTION

Figure 1:
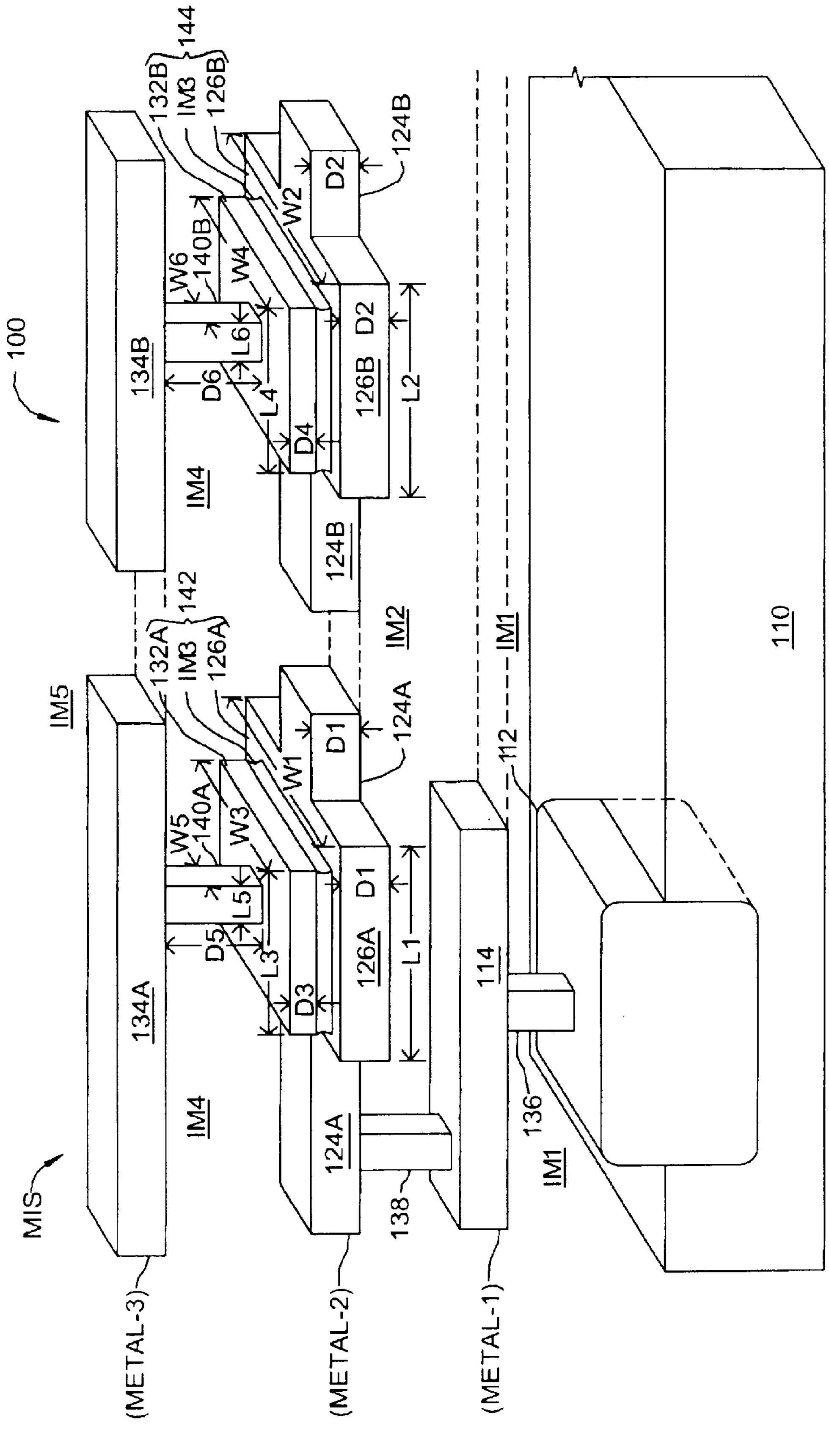
FIG. 1 is a perspective view illustrating an example of an integrated circuit structure 100 in accordance with the present invention.

FIG. 1 shows a perspective view that illustrates an example of an integrated circuit structure 100 in accordance with the present invention. As shown in FIG. 1, structure 100 includes a region of semiconductor material 110, such as a substrate or well, and a semiconductor device 112 that is formed in and on semiconductor material 110.

In addition, integrated circuit structure 100 includes a metal interconnect structure MIS that is formed on semiconductor material 110. Metal interconnect structure MIS includes a number of layers of metal regions, such as metal traces, and a number of layers of isolation material that isolate the metal regions.

In the example shown in FIG. 1, metal interconnect structure MIS includes a first layer of isolation material IM1 that is formed on semiconductor material 110, and a metal trace 114 that is formed on isolation material IM1 from a first layer of metal (metal-1). Structure MIS also includes a second layer of isolation material IM2 that is formed on isolation layer IM1 and metal trace 114.

In addition, metal interconnect structure MIS includes a metal trace 124A, a first bottom metal plate 126A, a metal trace 124B, and a second bottom metal plate 126B that are formed on isolation layer IM2 from a second layer of metal (metal-2).

In the example shown, bottom plate 126A adjoins metal trace 124A, being formed as a widened area of the metal trace during the patterning and etching process used to form the metal-2 traces and plates. Bottom plate 126A has a width W1 that is wider than the width of adjacent metal trace 124A, a depth D1 that is equal to the depth of metal trace 124A, and a length L1.

Similarly, bottom plate 126B adjoins metal trace 124B, being formed as a widened area of the metal trace during the patterning and etching process used to form the metal-2 traces. Bottom plate 126B has a width W2 that is wider than the width of adjacent metal trace 124B, a depth D2 that is equal to the depth of metal trace 124B, and a length L2.

Metal interconnect structure MIS additionally includes a third layer of isolation material IM3 that is formed on bottom metal plates 126A and 126B, and spaced-apart top metal plates 132A and 132B that are formed on isolation layer IM3 from an intermediate layer of metal. Top plate 132A is formed over, and vertically aligned with, bottom plate 126A, while top plate 132B is formed over, and vertically aligned with, bottom plate 126B.

Top plate 132A has a width W3, a depth D3, and a length L3, while top plate 132B has a width W4, a depth D4, and a length L4. In the example shown, the width, length, and depth dimensions of top plates 132A and 132B are less than the respective dimensions of bottom plates 126A and 126B. However, top plates 132A and 132B and bottom plates 126A and 126B can alternately be formed to any dimensions required by the device design.

Metal interconnect structure MIS further includes a fourth layer of isolation material IM4 that is formed over isolation layer IM2, metal traces 124A and 124B, metal plates 126A and 126B, and metal plates 132A and 132B. In addition, structure MIS includes metal traces 134A and 134B that are formed on isolation layer IM4 from a third layer of metal (metal-3), and a fifth layer of isolation material IM5 that is formed on isolation layer IM4 and metal traces 134A and 134B. The isolation layers IM1–IM5 can be formed from the same or different materials.

Further, metal interconnect structure MIS includes a number of contacts, such as contact 136, that are formed through isolation layer IM1. Contact 136 makes an electrical connection with semiconductor device 112 and metal trace 114. Metal interconnect structure MIS also includes a number of vias that are formed through isolation layers IM2, such as via 138. Via 138 electrically connects metal trace 114 to metal trace 124A.

In addition, metal interconnect structure MIS includes a number of vias that are formed through isolation layers IM4, such as vias 140A and 140B. Via 140A electrically connects top plate 132A to metal trace 134A, while via 140B electrically connects top plate 132B to metal trace 134B.

Via 140A has a width W5, a depth D5, and a length L5, while via 140B has a width W6, a depth D6, and a length L6. As shown in FIG. 1, the width W5 and length L5 of via 140A is less than the width W3 and length L3, respectively, of top plate 132A. Similarly, the width W6 and length L6 of via 140B is less than the width W4 and length L4, respectively, of top plate 132B.

In the present invention, bottom metal plate 126A, isolation material IM3, and top metal plate 132A form an antifuse 142, while bottom metal plate 126B, isolation material IM3, and top metal plate 132B form a metal-insulator-metal (MIM) capacitor 144. Further, although antifuse 142 and MIM capacitor 144 utilize the second and intermediate metal layers, antifuse 142 and capacitor 144 can alternately be formed using other metal layers and an adjacent intermediate metal layer.

One of the advantages of the present invention is that a semiconductor fabrication process that includes MIM capacitors, such as capacitor 144, can add antifuses, such as antifuse 142, to the chip without the need for any additional manufacturing steps because antifuse 142 and capacitor 144 are structurally similar. An additional advantage is that antifuse 142 can serve as a capacitor in a circuit until needed as an antifuse.

Figure 2A:
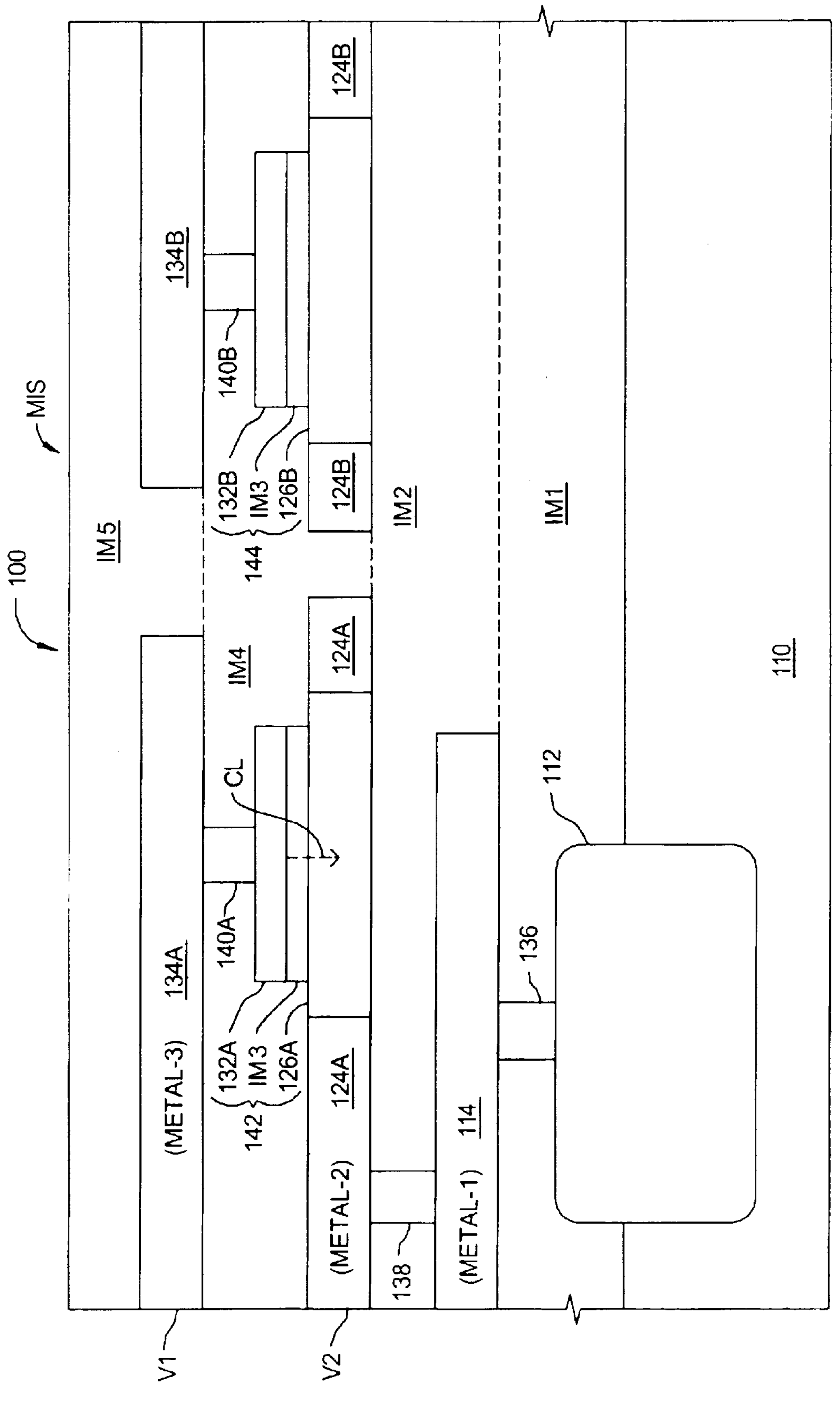
FIGS. 2A–2C are a series of cross-sectional views of integrated circuit structure 100 illustrating an example of a method of programming antifuse 142 in accordance with the present invention.
Figure 2B:
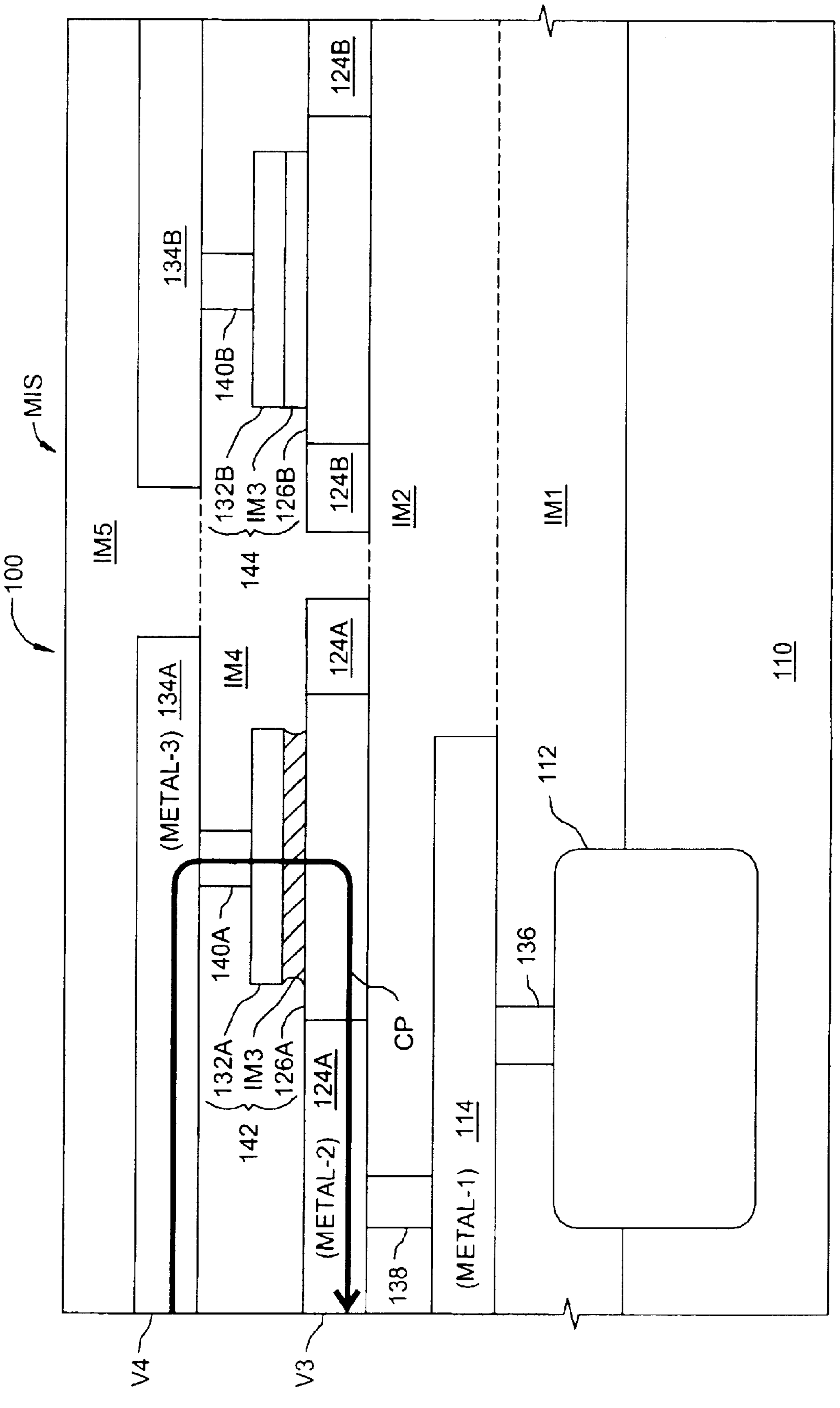
Figure 2C:
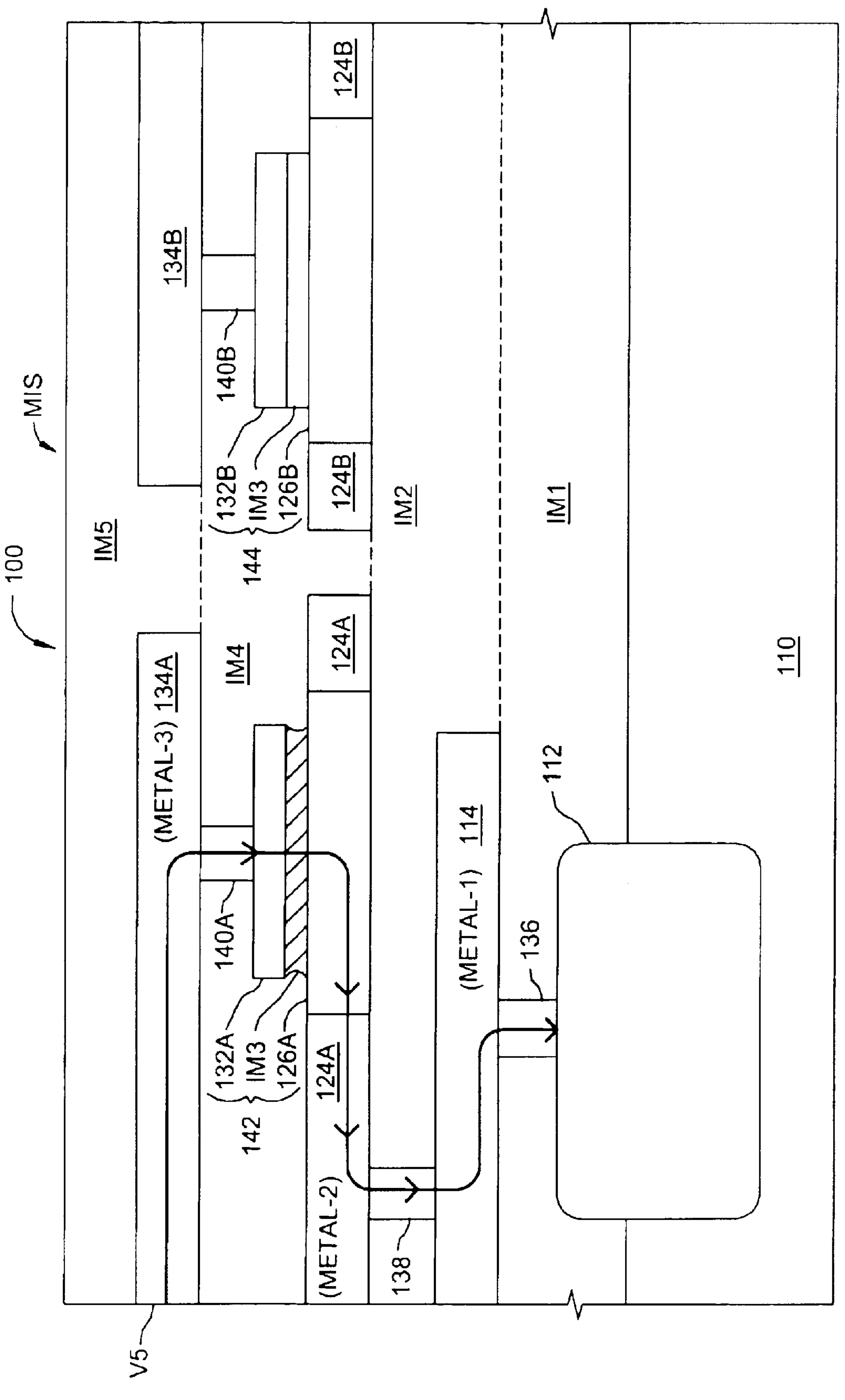

FIGS. 2A–2C show a series of cross-sectional views of integrated circuit structure 100 that illustrate an example of a method of programming antifuse 142 in accordance with the present invention. As shown in FIG. 2A, prior to programming, when a first voltage difference is applied across metal plates 126A and 132A and the first voltage difference is greater than zero but less than the breakdown voltage of isolation material IM3 between plates 126A and 132A, antifuse 142 functions as a capacitor with only a small leakage current CL passing between top plate 132A and bottom plate 126A. For example, the first voltage difference can be formed when a first voltage V1 is placed on metal trace 134A and a second voltage V2 is placed on metal trace 124A.

As shown in FIG. 2B, when antifuse 142 is to be programmed, a second voltage difference is applied across metal plates 126A and 134A where the second voltage difference is greater than the breakdown voltage of isolation material IM3 between plates 126A and 132A. For example, the second voltage difference can be formed when a third voltage V3 is placed on metal trace 124A and a fourth voltage V4 is placed on metal trace 134A.

For example, 30 volts can be placed on top plate 132A through metal trace 134A, while ground can be placed on bottom plate 126A through trace 124A, when isolation material IM3 is an oxide a few hundred angstroms thick. Alternately, +1.2V can be placed on top plate 132A through metal trace 134A, while −28.8V can be placed on bottom plate 126A through trace 124A, when isolation material IM3 is an oxide a few hundred angstroms thick. When exposed to the relatively high second voltage difference between voltage V3 and voltage V4 (e.g., 30V), isolation material IM3 breaks down, thereby forming a conductive path from metal antifuse plate 132A to metal antifuse plate 126A.

After the second voltage difference has been applied, the second voltage difference is removed when a predetermined condition occurs. The predetermined condition can be, for example, a predetermined increase in the magnitude of the current flowing from plate 132A to plate 126A, or a predetermined period of time. After the conductive path has been formed but before the second voltage difference has been removed, a breakdown current CP flows from top plate 132A to bottom plate 126A that is substantially larger than the leakage current CL. Trace 124A provides a ground path for breakdown current CP to prevent current CP from damaging semiconductor device 112.

As shown in FIG. 2C, after the second voltage difference has been removed and antifuse 142 has been programmed, a voltage V5 on top metal antifuse plate 132A is substantially equal to the voltage on bottom metal antifuse plate 126A. When voltage V5 is connected to metal trace 134A, voltage V5 is placed on device 112 through metal trace 124A, via 138, metal trace 114, and contact 136 (as shown by the arrow). The voltage V5 placed on device 112 allows device 112 to operate in a conventional manner. Prior to programming antifuse 142, the voltage on device 112 did not allow device 112 to operate in the conventional manner.

In the present invention, the second voltage difference is never formed across the first and second metal capacitor plates 126B and 132B. As a result, a conductive path is never formed between the first and second metal capacitor plates 126B and 132B. For example, if 30 volts are placed on top plate 132A while ground is placed on bottom plates 126A and 126B (to exceed the breakdown voltage across plates 126A and 132A), then 30V is never placed on top plate 132B. Alternately, if −28.8V is placed on bottom plate 126A, then −28.8V is never placed on bottom plate 126B.

Thus, second metal antifuse plate 132A is electrically isolated from second metal capacitor plate 132B, or first metal antifuse plate 126A is electrically isolated from first metal capacitor plate 126B. Alternately, second metal antifuse plate 132A can be electrically isolated from second metal capacitor plate 132B, and first metal antifuse plate 126A can be electrically isolated from first metal capacitor plate 126B.

Figure 3A:
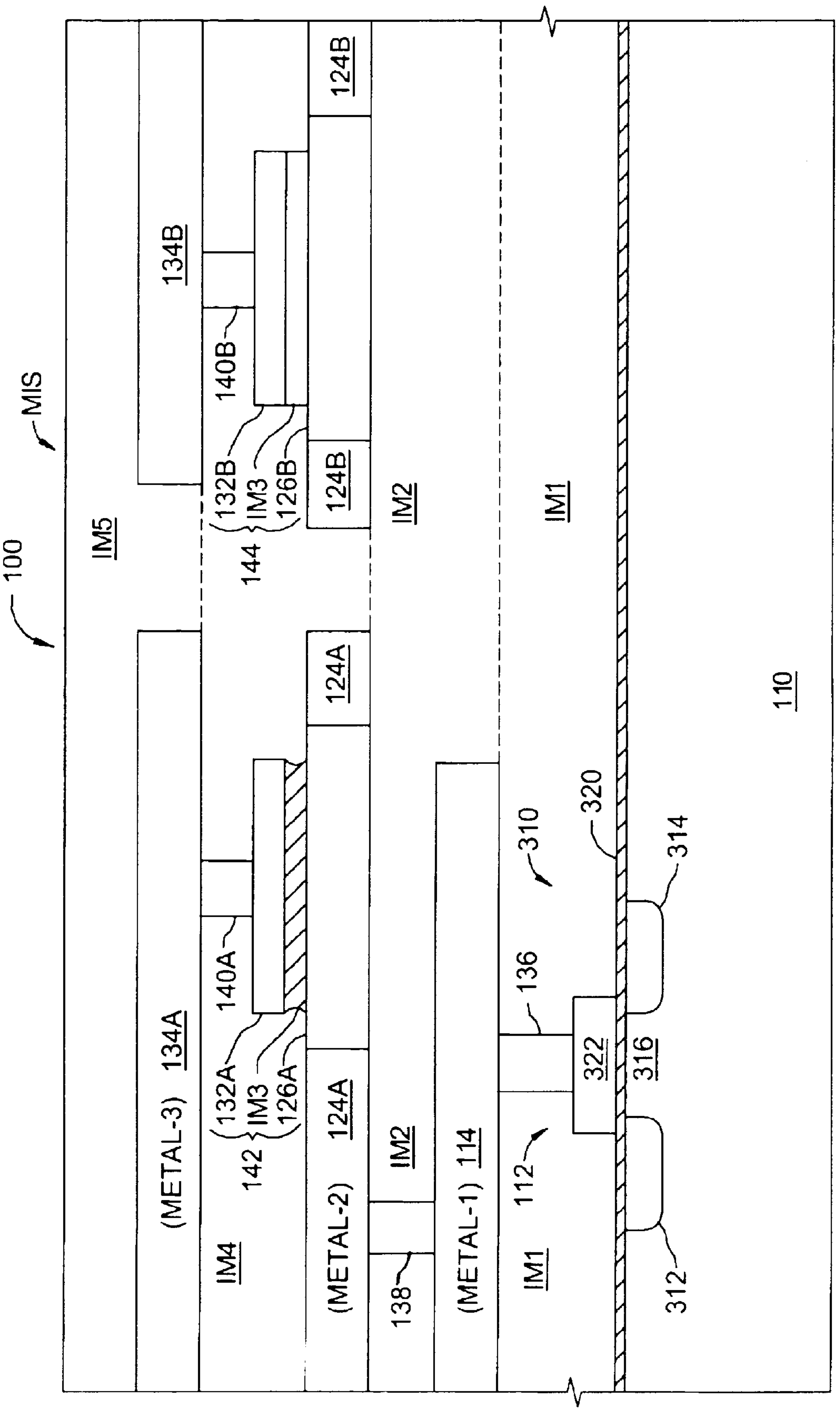
FIGS. 3A–3F are cross-sectional views of structure 100 illustrating a number of examples of device 112 in accordance with the present invention.

FIGS. 3A–3F show cross-sectional views of integrated circuit 100 that illustrate a number of examples of device 112 in accordance with the present invention. FIG. 3A shows a cross-sectional view of structure 100 that illustrates device 112 as a MOS transistor 310 in accordance with the present invention.

As shown in FIG. 3A, MOS transistor 310 includes spaced apart, heavily-doped source and drain regions 312 and 314 that are formed in semiconductor material 110, and a channel region 316 that is located between source and drain regions 312 and 314. Source and drain regions 312 and 314 have a conductivity type opposite to the conductivity type of material 110. In addition, MOS transistor 310 includes a layer of gate oxide 320 that is formed over channel region 316, and a gate 322 that is formed over channel region 316 on gate oxide layer 320.

As further shown in FIG. 3A, contact 136 is connected to gate 322 of MOS transistor 310. In one example, prior to programming, the voltage on gate 322 is insufficient to turn on or turn off transistor 310. However, after programming, a voltage can be placed on gate 322 via trace 134A that is sufficient to turn on or turn off transistor 310.

Figure 3B:
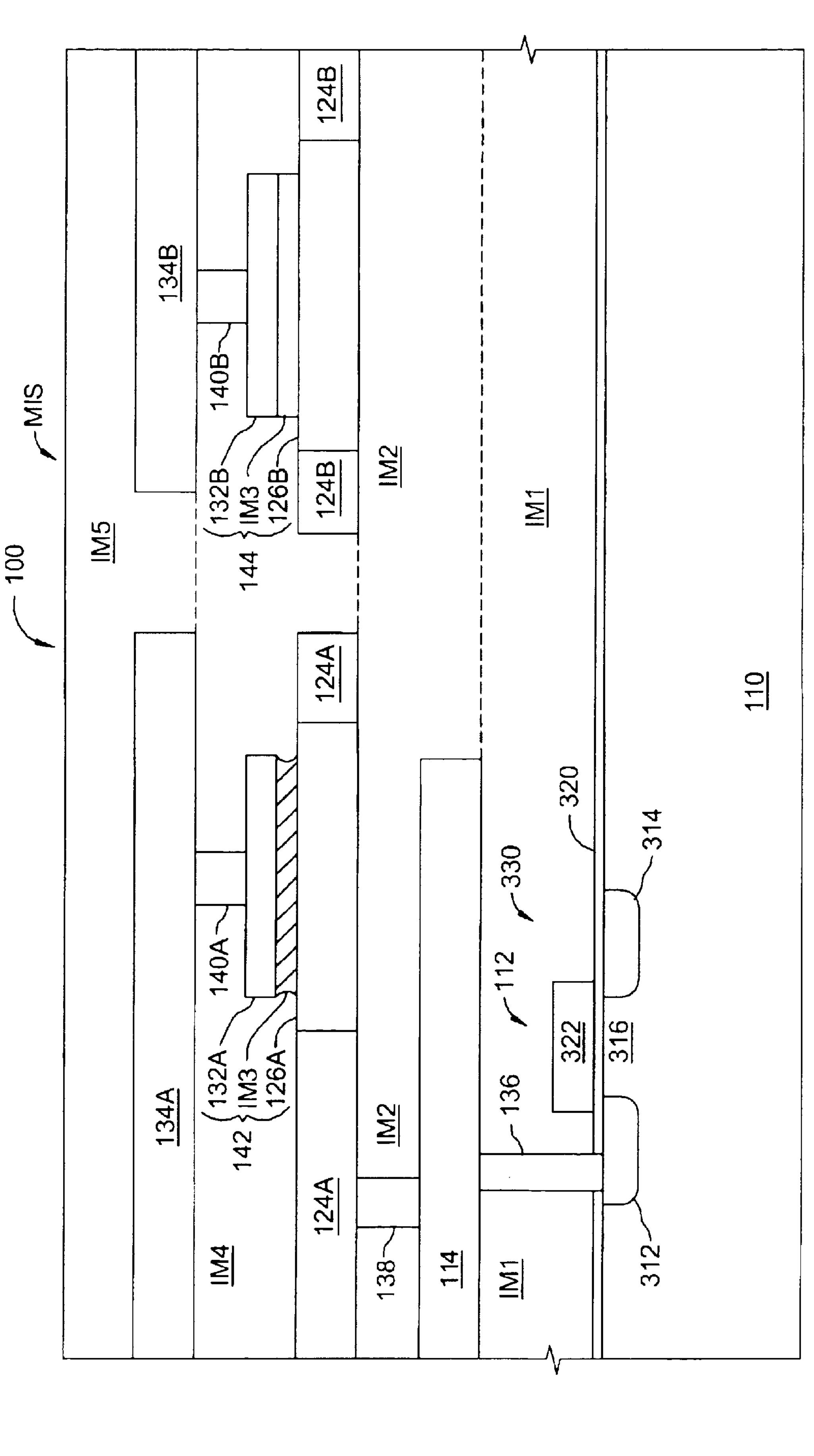

FIG. 3B shows a cross-sectional view of structure 100 that alternately illustrates device 112 as a MOS transistor 330. As shown, transistor 330 is similar to transistor 310 and, as a result, utilizes the same reference numerals to designate the structures that are common to both transistors.

As shown in FIG. 3B, transistor 330 differs from transistor 310 in that transistor 330 has source region 312 connected to contact 136. In one example, prior to programming, the voltage on source region 312 does not allow a current to flow between source and drain regions 312 and 314. However, after programming, a voltage can be placed on source region 312 via trace 134A that allows a current to flow between source and drain regions 312 and 314 when voltages sufficient to turn on transistor 330 are placed on gate 322 and drain 314.

Figure 3C:
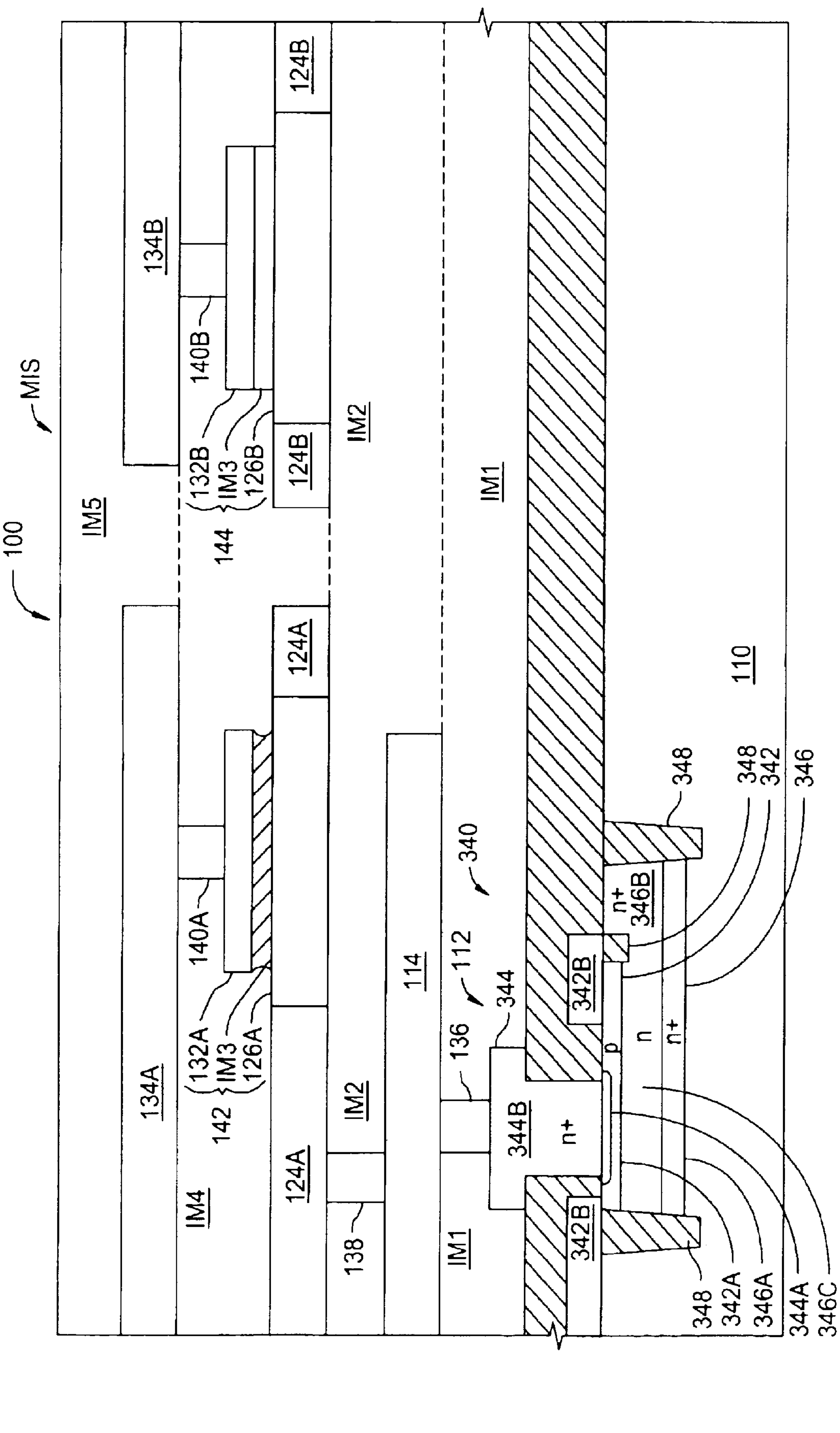

FIG. 3C shows another alternate cross-sectional view of integrated circuit structure 100 that illustrates device 112 as a bipolar transistor 340 in accordance with the present invention. Bipolar transistor 340, which is formed in and on semiconductor material 110, has a p-type base 342 (including an intrinsic base region 342A and extrinsic base regions 342B); an n-type emitter 344 (including an intrinsic emitter region 344A and a polysilicon extrinsic emitter region 344B) formed on base region 342; and an n-type collector 346 (including an n+ buried layer 346A, an implanted n+ sinker region 346B, and a collector region 346C) connected to base 342. Transistor 340 also includes a number of trench isolation regions 348 that are formed in semiconductor material 110.

In the FIG. 3C example, antifuse 142 is electrically connected with emitter 344 through conductive contact 136, which is, in turn, connected to metal trace 114. Antifuse 142 can be programmed by using the programming steps described above. In one example, prior to programming, the voltage on emitter 344 does not allow a current to flow between emitter and collector regions 344 and 346. However, after programming, a voltage can be placed on emitter region 344B via trace 134A that allows a current to flow between emitter 344 and collector 346 when voltages sufficient to turn on transistor 340 are placed on collector 346 and base 342.

Figure 3D:
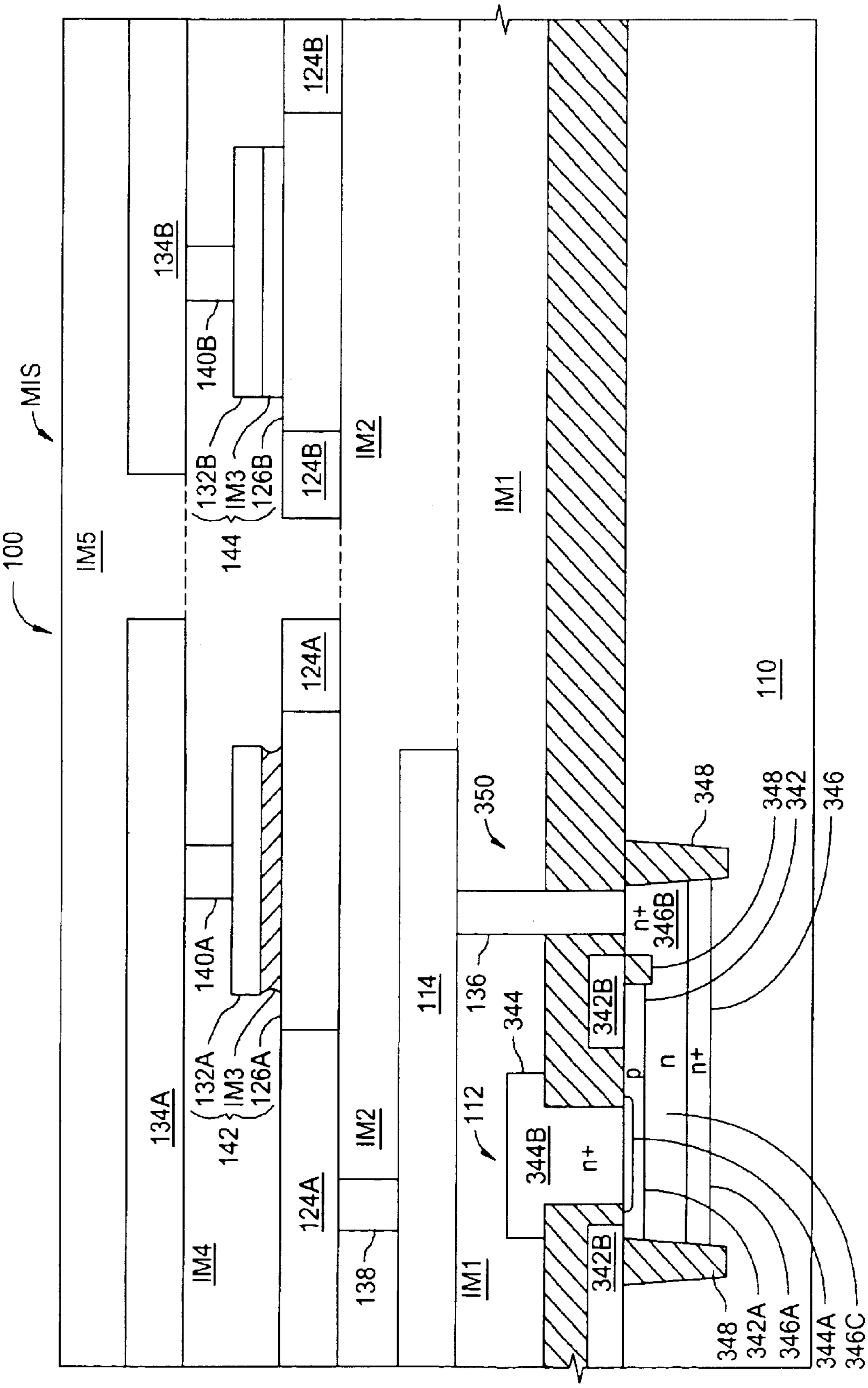

FIG. 3D shows a cross-sectional view of structure 100 that alternately illustrates device 112 as a bipolar transistor 350. As shown, transistor 350 is similar to transistor 340 and, as a result, utilizes the same reference numerals to designate the structures that are common to both transistors.

As shown in FIG. 3D, transistor 350 differs from transistor 340 in that transistor 350 has collector region 346B connected to contact 136. In one example of this circuit, prior to programming, the voltage on collector 346 did not allow a current to flow between emitter and collector regions 344 and 346. However, after programming, a voltage can be placed on collector region 346B that allows a current to flow between emitter and collector regions 344 and 346 when voltages sufficient to turn on transistor 350 are placed on base 342 and emitter 344.

Figure 3E:
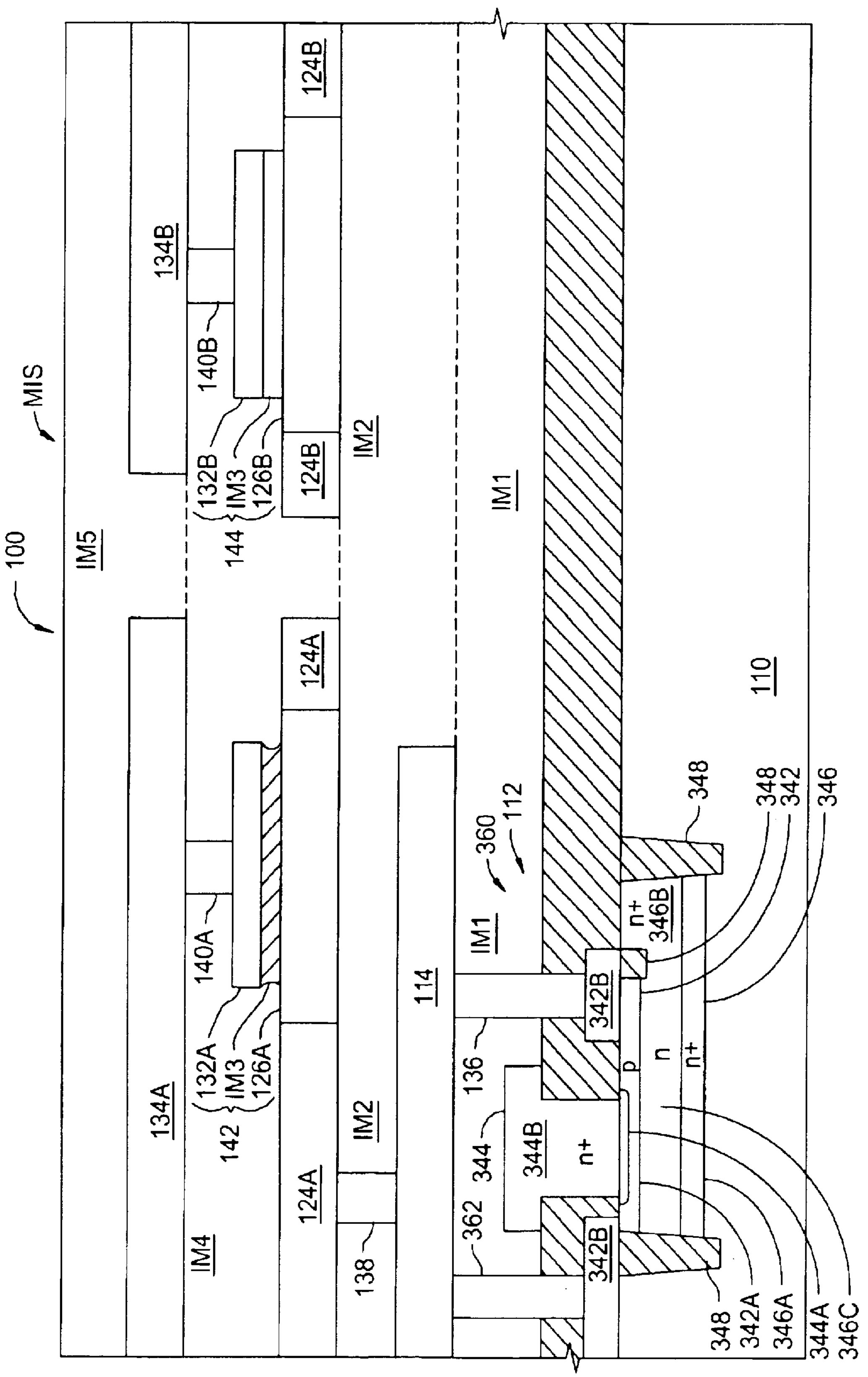

FIG. 3E shows a cross-sectional view of structure 100 that alternately illustrates device 112 as a bipolar transistor 360. Transistor 360 is similar to transistor 340 and, as a result, utilizes the same reference numerals to designate the structures that are common to both transistors.

As shown in FIG. 3E, transistor 360 differs from transistor 340 in that transistor 360 has a first extrinsic base region 342B connected to contact 136, and a contact 362 that connects a second extrinsic base region 342B to metal trace 114.

In one example of this circuit, prior to programming, the voltage on base 342 did not allow a current to flow between emitter and collector regions 344 and 346. However, after programming, a voltage can be placed on base regions 342B that allows a current to flow between emitter and collector regions 344 and 346 when voltages sufficient to turn on transistor 350 are placed on emitter 344 and collector 346.

Additionally, although npn junction bipolar transistors are illustrated in FIGS. 3C–3E, the invention also applies to the use of antifuse 142 in circuits having pnp junction transistors. Further, although not shown in FIGS. 3A–3E, an integrated circuit such as structure 100 would include additional electrical connections to link device 112 to other portions of the circuit.

Figure 3F:
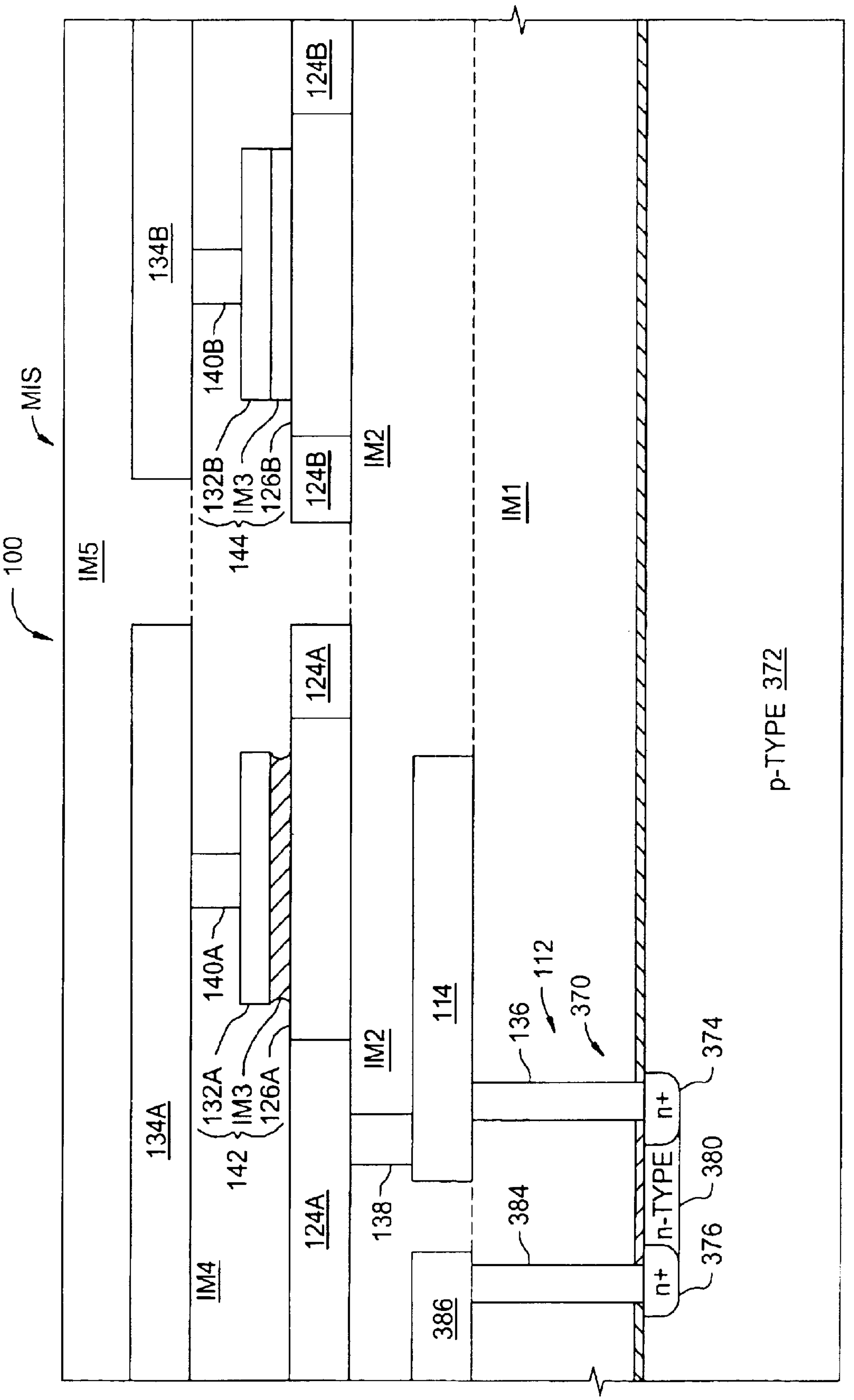

FIG. 3F shows a cross-sectional view of structure 100 that alternately illustrates device 112 as a resistor 370 in accordance with the present invention. As shown in FIG. 3F, resistor 370, which is formed in a p-type region 372 of material 110, includes a first n+ implanted region 374, a second spaced apart n+ implanted region 376, and an n-type region 380 located between and contacting first n+ region 374 and second n+ region 376. In the present example, n+ region 374 is electrically connected with antifuse 142 through contact 136, metal trace 114, via 138, and trace 124A. N+ region 376 is connected to a conductive contact 384 which is connected to a metal trace 386 formed from the metal-1 layer.

In one example of this circuit, prior to programming, the voltage on n+ region 374 is insufficient to allow a current to flow thru resistor 370. However, after programming, an operating voltage can be placed on region 374 that allows a current to flow between regions 374 and 376.

Figure 4A:
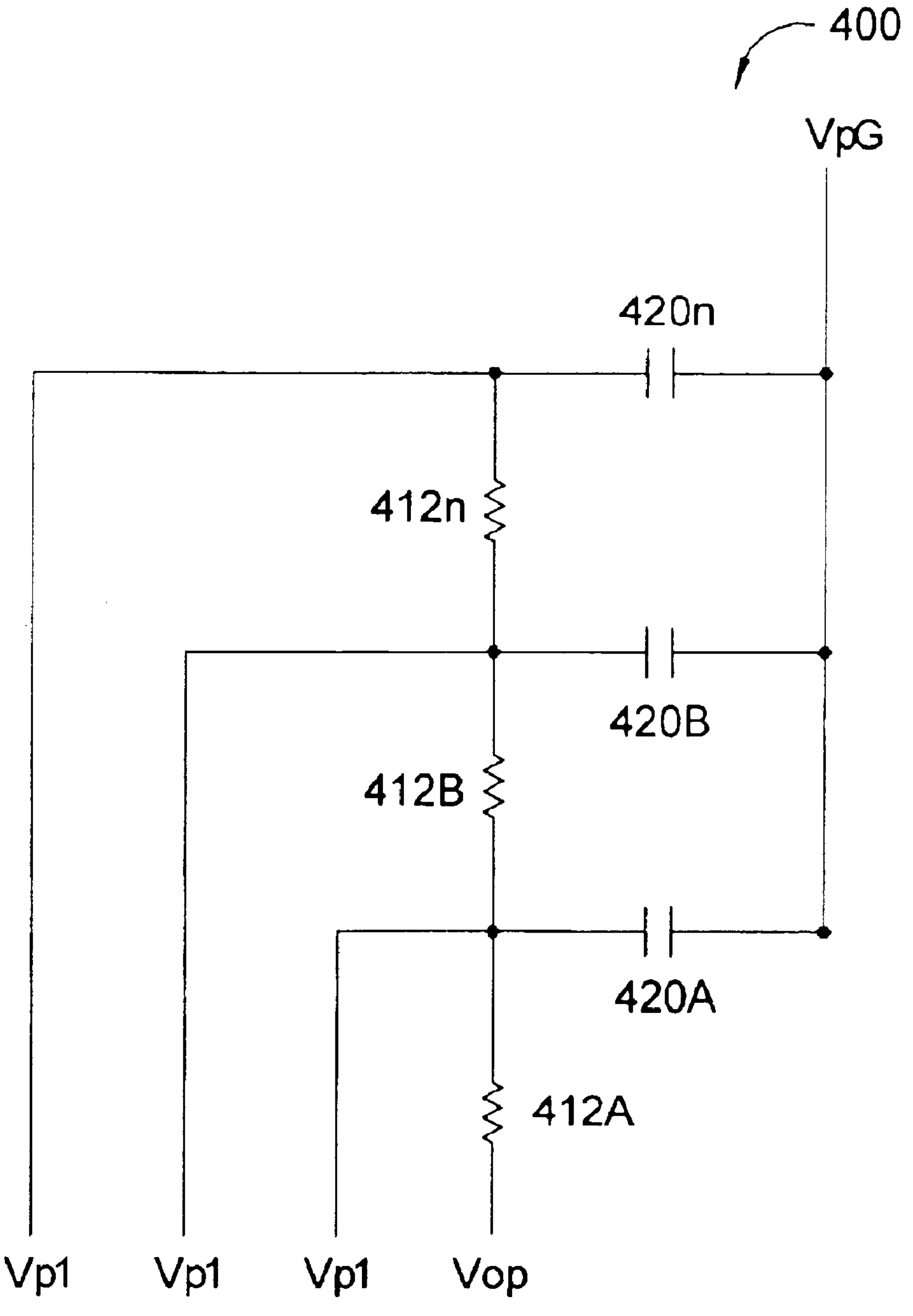
FIGS. 4A and 4B are views illustrating an example of a trimmable resistor 400 in accordance with the present invention.
Figure 4B:
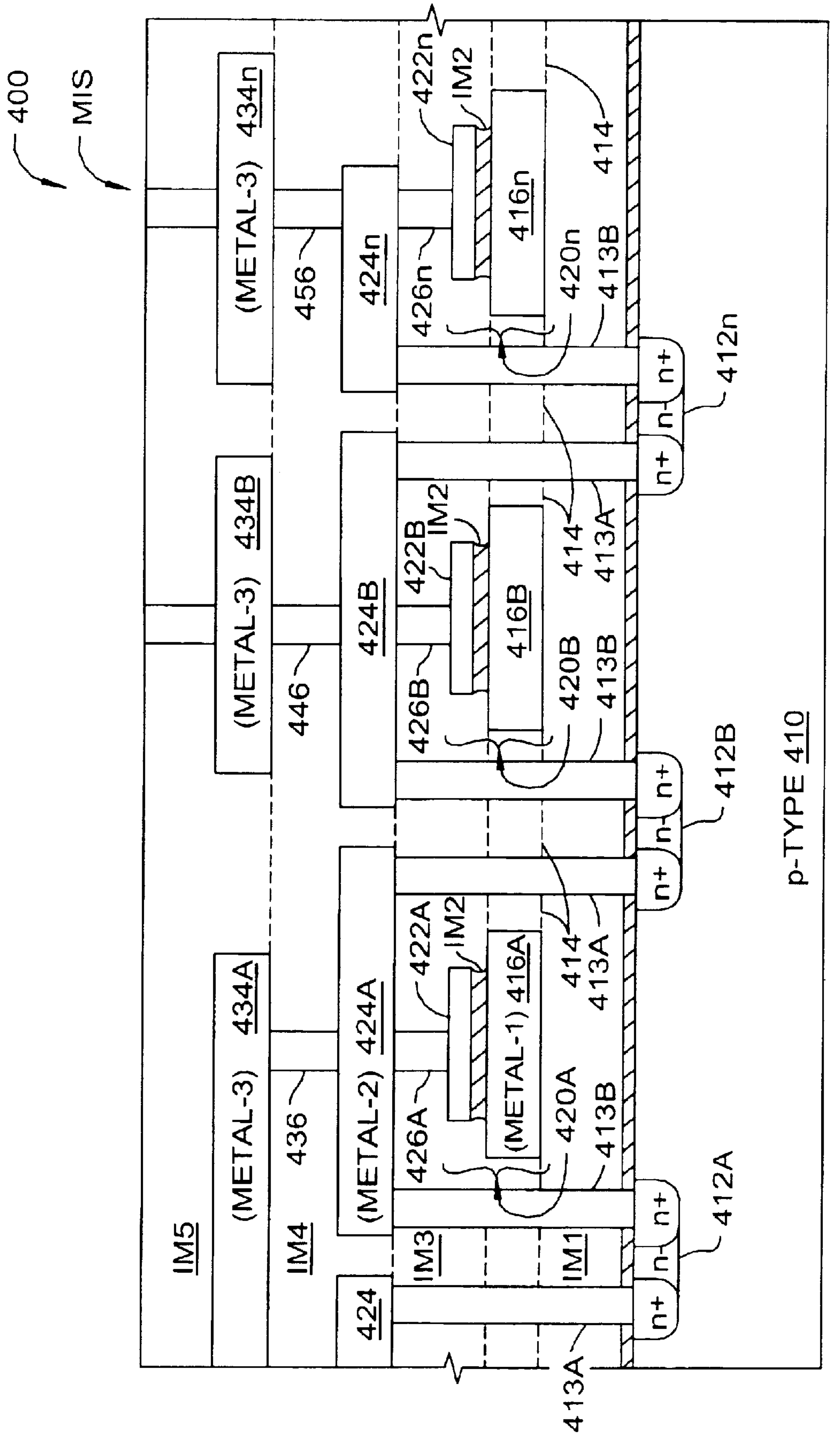

The present invention can also be utilized with trimmable devices, such as resistor and capacitor networks, where the device and the antifuse share a common node. FIGS. 4A and 4B show views that illustrate an example of a trimmable resistor 400 in accordance with the present invention. FIG. 4A is a schematic diagram of the circuit, and FIG. 4B is a cross-sectional view of resistor 400. As shown in FIG. 4A, resistor 400 includes a series of resistive segments 412A–412*n*, and a series of antifuses 420A–420*n* that are connected to the segments 412A–412*n* so that an antifuse 420 is connected to the end of each segment 412. Further, a programming voltage Vp1 can be switchably applied to each antifuse 420.

As shown in FIG. 4B, resistor 400 includes a semiconductor material 410, such as a well or a substrate, and a multi-level metal interconnect structure MIS that is formed over semiconductor material 410. Metal interconnect structure MIS further includes a number of layers of isolation material IM that are formed over material 410, and a number of metal layers formed on the layers of isolation material. The example includes five layers of isolation material IM1–IM5, and four layer of metal (three standard metal layers and an intermediate metal layer). The interconnect structure MIS can, alternately, include additional metal layers or fewer metal layers.

As further shown in FIG. 4B, resistors 412A, 412B, and 412*n* are formed as implanted regions in semiconductor material 410. Three conductive contacts 413A are formed to connect with the input region of each resistive segment 412. Similarly, conductive contacts 413B are formed to connect with the output region of each resistive segment 412.

In resistor 400, the metal-1 layer includes a first metal trace 414 formed on isolation material IM1 (metal trace 414 is shown with dashed lines to indicate that it does not connect to contacts 413A and 413B). Also formed from the metal-1 layer are a series of bottom plates 416A–416*n* of antifuses structures 420A, 420B, and 420*n*. Each bottom plate 416 adjoins metal trace 414, being formed as a widened area of the metal trace during the patterning and etching process used to form the metal-1 traces.

Resistor 400 further includes a layer of isolation material IM2 that is formed on the bottom plates 416A–416*n*, and a series of top plates 422A–422*n* that are formed on layer IM2 from an intermediate layer of metal, and vertically spaced apart from the respective bottom plates 416A–416*n*. A series of conductive vias 426A–426*n* are formed to contact the top plates 422A–422*n*.

A third layer of isolation material IM3 is formed over top plates 422A–422*n*, the metal-1 regions 414 and 416A–416*n*, and layer IM1, while a second layer of metal (metal-2), which includes a series of metal traces 424A–424*n*, is formed on isolation layer IM3. A fourth layer of isolation material IM4 is formed on isolation layer IM3 and metal traces 424A–424*n*. A third metal layer (metal-3), which includes a series of metal traces 434A–434*n*, is formed on isolation layer IM4, while a fifth isolation layer IM5 is formed on isolation layer IM4 and metal traces 434A–434*n*. The isolation layers IM1–IM5 can be formed from the same or different materials.

Further, resistor 400 includes a number of vias, such as via 436 (formed through isolation layer IM4 to make an electrical connection with metal traces 424A and 434A), via 446 (formed through layer IM4 to make an electrical connection with traces 424B and 434B), and via 456 (formed through layer IM4 to make an electrical connection with traces 424*n* and 434*n*).

The antifuses 420A–420*n* function in a capacitive non-conductive state when voltages are placed on the top plates 422A–422*n* before the antifuses 420A–420*n* are programmed; and function in a conductive state when voltages are placed on the top plates 422A–422*n* when the antifuses 420A–420*n* have been programmed.

As shown in FIG. 4A and FIG. 4B, resistor 400 can be trimmed by programming one or more of the antifuses 420A–420*n*, and then placing an operating voltage on metal trace 424. Antifuses 420A, 420B, and 420*n* can be programmed using a method similar to that previously described to program antifuse 142 in circuit 100 (as shown in FIGS. 2A–2C).

To program antifuse 420A, a programming voltage Vp1 is applied to trace 434A until a predetermined condition occurs, while ground VpG is applied to the bottom plate 416A of the antifuse via trace 414. To program antifuse 420B, the programming voltage Vp1 is placed on trace 434B until a predetermined condition occurs. In a like manner, to program antifuse 420*n*, the programming voltage Vp1 is placed on trace 434*n* until a predetermined condition occurs.

If only antifuse 420A is programmed (or conductive), only resistor 412A is included in the circuit. If only antifuse 420B is programmed, resistors 412A and 412B are placed in series, increasing the resistance and, thus, modifying the voltage drop across the circuit. Similarly, if only antifuse 420*n* is programmed, all three resistors 412A, 412B and 412*n* are placed in series. In addition, if antifuses 420A and 420B are both programmed, resistors 412A and 412B are placed in parallel.

After the antifuses are programmed, the programming voltage Vp1 is removed, and an operating voltage Vop is placed on trace 424 to allow the circuit to function in a conventional manner.

Figure 5:
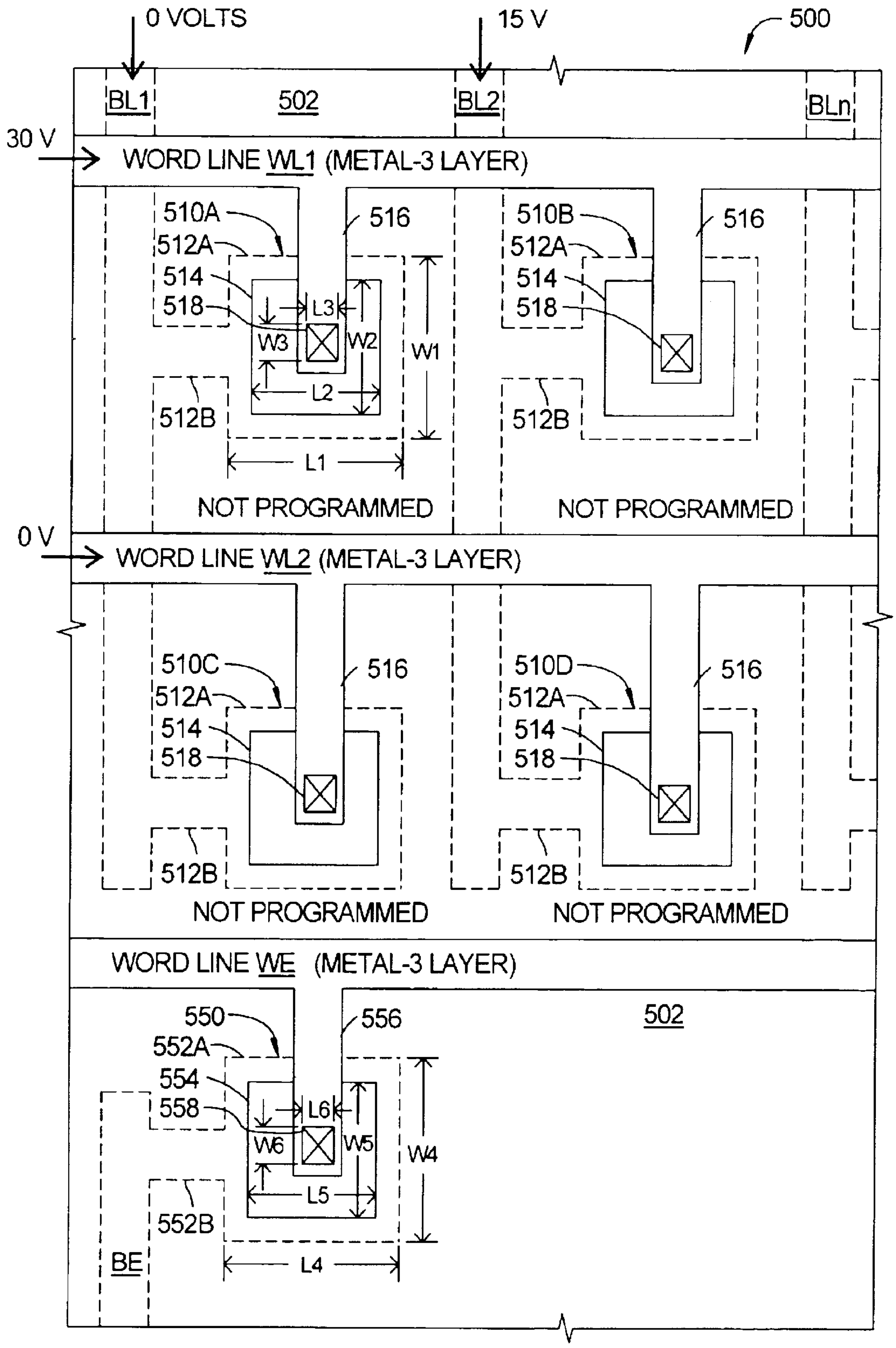
FIG. 5 is a plan view illustrating an example of a metal interconnect structure 500 in accordance with the present invention.

FIG. 5 shows a plan view that illustrates an example of a metal interconnect structure 500 in accordance with the present invention. Interconnect structure 500 is formed over a semiconductor material, such as a well or a substrate (not shown). Structure 500 includes a series of bit lines BL1–BLn and a bit line BE. Structure 500 further includes a series of word lines WL1–WLn that run perpendicularly to bit lines BL1–BLn, and a word line WE that runs perpendicularly to bit line BE.

Bit lines BL1–BLn and BE are formed from metal traces on a metal layer, such as metal-2 (shown as dashed lines). Word lines WL1–WLn and WE are formed from metal traces on an overlying metal layer, such as metal-3, and are vertically spaced apart from bit lines BL1–BLn and BE. An isolation material 502 is formed in the spaces between adjacent metal traces.

As further shown in the FIG. 5 example, structure 500 also includes an array of antifuses that includes antifuses 510A, 510B, 510C, and 510D. Each of the antifuses 510A–510D includes a bottom metal plate 512A and an adjoining metal trace 512B, which are both formed from the metal-2 layer.

Bottom plate 512A is formed as a widened area of metal trace 512B during the patterning and etching process used to form the metal-2 traces and plates. Bottom plate 512A has a width W1 that is wider than the width of metal trace 512B, a depth that is equal to the depth of metal trace 512B, and a length L1.

Each antifuse 510 also includes a top metal plate 514 formed from an intermediate metal layer that overlies and is spaced apart from the bottom metal plate 512, and an isolation material, such as isolation material IM3, that is formed in the space between top metal plate 514 and bottom metal plate 512. Top plate 514 has a width W2, a depth, and a length L2. The width, length, and depth dimensions of top plate 514 are less than the respective dimensions of bottom plate 512. However, top plate 514 and bottom plate 512 can alternately be formed to any dimensions required by the device design.

Each top plate 514 is connected to a metal trace 516 that is connected to a word line WL in the overlying metal-3 layer through a conductive via 518. Via 518 has a width W3, a depth, and a length L3. As shown in FIG. 5, the width W3 and length L3 of via 518 is less than the width W2 and length L2, respectively, of top plate 514.

Each of the antifuses 510A–510D can be individually programmed by applying a combination of differing voltages to the bit lines BL and word lines WL in the array. In the example shown, a voltage difference of 30 volts is required to program an antifuse. Therefore, to program antifuse 510A, a voltage difference having a magnitude of 30 volts can be formed, for example, by applying 30V to word line WL1 and a zero (ground) voltage to bit line BL1.

To limit the programming process in the first row to antifuse 510A, a voltage having a magnitude of, for example, 15 volts can be applied to bit line BL2, and a voltage of, for example, zero (ground) can be applied to word line WL2. When exposed to the relatively high voltage difference (30V) across plates 512A and 514, isolation material IM3 breaks down, thereby forming a conductive path from metal antifuse plate 514 to metal antifuse plate 512A.

However, the voltage differences across antifuses 510B–510D are not sufficient to generate currents capable of changing the isolation materials in these antifuses to a conductive state. Thus, antifuses 510B–510D remain unprogrammed (antifuse 510B is exposed to a differential of 15 volts, antifuse 510C to a differential of zero volts, and antifuse 510D to a differential of 15 volts).

After the voltage difference has been applied, the voltage difference is removed when a predetermined condition occurs. The predetermined condition can be, for example, a predetermined increase in the magnitude of the current flowing from plate 514 to plate 512A, or a predetermined period of time.

After the conductive path has been formed but before the voltage difference has been removed, a breakdown current flows from top plate 514 to bottom plate 512A. The breakdown current is substantially larger than a leakage current that is present when the voltage difference is less than the breakdown voltage.

After the voltage difference has been removed and antifuse 510A has been programmed, a voltage V5 on top metal antifuse plate 514 of antifuse 510A is substantially equal to the voltage on bottom metal antifuse plate 512 of antifuse 510A.

As further shown in FIG. 5, structure 500 also includes a capacitor 550. Capacitor 550 includes a bottom metal plate 552A and an adjoining metal trace 552B, which are both formed from the metal-2 layer. Bottom plate 552A is formed as a widened area of metal trace 552B during the patterning and etching process used to form the metal-2 traces and plates. Bottom plate 552A has a width W4 that is wider than the width of metal trace 552B, a depth that is equal to the depth of metal trace 552B, and a length L4. In addition, bottom plates 512A and 552A have substantially equal depths.

Capacitor 550 also includes a top metal plate 554 formed from the intermediate metal layer that overlies and is spaced apart from, bottom metal plate 552A, and an isolation material, such as isolation layer IM3, that is formed in the space between top metal plate 554 and bottom metal plate 552. Top plate 554 has a width W5, a depth, and a length L5.

In addition, top plates 514 and 554 have substantially equal depths. In the example shown, the width, length, and depth dimensions of top plate 554 are less than the respective dimensions of bottom plate 552A. However, top plate 554 and bottom plate 552A can alternately be formed to any dimensions required by the device design.

Top plate 554 is connected to a metal trace 556 that is connected to a word line WE in the overlying metal-3 layer through a conductive via 558. Via 558 has a width W6, a depth, and a length L6. As shown in FIG. 5, the width W6 and length L6 of via 558 is less than the width W5 and length L5, respectively, of top plate 554.

In the present invention, a voltage difference greater than the breakdown voltage is never formed across the first and second metal capacitor plates 552A and 554. As a result, a conductive path is never formed between the first and second metal capacitor plates 552A and 554. For example, if 30 volts are placed on top plate 514 while ground is placed on bottom plates 512A and 552A (to exceed the breakdown voltage across plates 514 and 512A), then 30V is never placed on top plate 554. Alternately, if −28.8V is placed on bottom plate 512A, then −28.8V is never placed on bottom plate 552A.

Thus, second metal antifuse plate 514 is electrically isolated from second metal capacitor plate 554, or first metal antifuse plate 512A is electrically isolated from first metal capacitor plate 552A. Alternately, as shown in FIG. 5, second metal antifuse plate 514 can be electrically isolated from second metal capacitor plate 554, and first metal antifuse plate 512A can be electrically isolated from first metal capacitor plate 552A.

As above, one of the advantages of structure 500 is that antifuses 510A–510D can be formed at the same time that a metal-insulator-metal (MIM) capacitor 550 is formed. As a result, antifuses 510 can be integrated into a fabrication process with a MIM capacitor submodule with no additional process steps.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of operating an integrated circuit, the integrated circuit including:

an antifuse having:

a first metal antifuse plate;

a layer of dielectric material connected to the first metal antifuse plate; and a second metal antifuse plate connected to the layer of dielectric material and vertically aligned with the first metal antifuse plate, the second metal antifuse plate having a thickness, a length, and a width;

a layer of isolation material connected to the second metal antifuse plate;

a via formed through the layer of isolation material to make an electrical connection with the second metal antifuse plate, the via having a length, a width, and a substantially uniform thickness, the length and width of the via being substantially less than the length and width, respectively, of the second antifuse plate;

a first metal trace positioned horizontally-adjacent and connected to the first metal antifuse plate, the first metal antifuse plate being a wider extension of the first metal trace; and a second metal trace formed on the layer of isolation material to contact the via, the second metal trace being vertically spaced apart from the first metal trace and the second metal antifuse plate;

the method comprising the steps of:

forming a voltage difference across the first and second metal antifuse plates; and removing the voltage difference from the first and second metal antifuse plates when a predetermined condition occurs, a conductive path being formed from the second metal antifuse plate to the first metal antifuse plate when the predetermined condition occurs.

2. The method of claim 1 wherein the integrated circuit includes a capacitor, the capacitor having:

a first metal capacitor plate;

the layer of dielectric material connected to the first metal capacitor plate; and a second metal capacitor plate connected to the layer of dielectric material and vertically aligned with the first metal capacitor plate.

3. The method of claim 2 wherein:

the first metal antifuse plate is electrically isolated from the first metal capacitor plate; and the second metal antifuse plate is electrically isolated from the second metal capacitor plate.

4. The method of claim 2 wherein:

a first voltage is placed on the first metal antifuse plate, and a second voltage is placed on the second metal antifuse plate to form the voltage difference, and the second voltage is never present on the second metal capacitor plate.

5. The method of claim 2 wherein:

a first voltage is placed on the first metal antifuse plate, and a second voltage greater than the first voltage is placed on the second metal antifuse plate to form the voltage difference, and the first voltage is never present on the first metal capacitor plate.

6. The method of claim 2 wherein:

the first metal antifuse plate has a substantially uniform first thickness; and the first metal capacitor plate has a substantially uniform second thickness that is substantially equal to the first thickness.

7. The method of claim 6 wherein:

the second metal antifuse plate has a substantially uniform third thickness; and the second metal capacitor plate has a substantially uniform fourth thickness that is substantially equal to the third thickness.

8. The method of claim 6 wherein the integrated circuit further includes a semiconductor device formed in a substrate, the semiconductor device being electrically connected to the antifuse.

9. The method of claim 8 wherein the semiconductor device has only an off state or an on state before the antifuse is programmed, and an off state and an on state after the antifuse is programmed.

10. The method of claim 9 wherein the semiconductor device includes a metal-oxide-silicon (MOS) transistor, the MOS transistor having a plurality of terminals, the terminals including a source region, a drain region, and a gate electrode, the antifuse being electrically connected to a terminal.

11. The method of claim 9 wherein the semiconductor device includes a bipolar transistor, the bipolar transistor having a plurality of terminals, the terminals including a base region, an emitter region, and a collector region, the antifuse being electrically connected to a terminal.

12. The method of claim 9 wherein the semiconductor device includes a resistor that has an input node and an output node, the input node being electrically connected with the antifuse, the resistor passing a first output current before the antifuse is programmed, and a second output current substantially larger than the first output current after the antifuse is programmed.

13. The method of claim 1 wherein the layer of isolation material is formed over and contacts the first metal trace.

14. The method of claim 1 wherein the via lies vertically over the first metal antifuse plate and the second metal antifuse plate.

15. The method of claim 3 wherein the layer of isolation material is formed over and contacts the first metal trace.

16. The method of claim 3 wherein the via lies vertically over the first metal antifuse plate and the second metal antifuse plate.

17. The method of claim 4 wherein the layer of isolation material is formed over and contacts the first metal trace.

18. The method of claim 5 wherein the via lies vertically over the first metal antifuse plate and the second metal antifuse plate.

19. The method of claim 9 wherein the layer of isolation material is formed over and contacts the first metal trace.

20. The method of claim 9 wherein the via lies vertically over the first metal antifuse plate and the second metal antifuse plate.

21. The method of claim 12 wherein the via lies vertically over the first metal antifuse plate and the second metal antifuse plate.

* * * * *